United States Patent [19]
Alonas et al.

[11] Patent Number: 5,500,912
[45] Date of Patent: Mar. 19, 1996

[54] HOLOGRAPHIC OPTICAL ISOLATOR UTILIZING OPTO-ELECTRONIC TRANSMITTER AND RECEIVER DISPOSED IN A PACKAGE

[75] Inventors: Paul G. Alonas, Scottsdale, Ariz.; Jang-Hun Yeh, Streamwood; Austin V. Harton, Oak Park, all of Ill.

[73] Assignee: Motorola, Inc., Schaumburg, Ill.

[21] Appl. No.: 433,886

[22] Filed: May 2, 1995

[51] Int. Cl.$^6$ ..................................... G02B 6/32
[52] U.S. Cl. .............................. 385/37; 359/15
[58] Field of Search ................. 385/12, 13, 14, 385/15, 11, 37, 39, 24, 27, 48, 147; 359/3, 15, 127, 160, 333, 341, 124, 156; 372/6, 70, 20–22; 250/227.11

[56]  References Cited

U.S. PATENT DOCUMENTS

| | | | |
|---|---|---|---|
| 4,077,699 | 3/1978 | Dyott et al. | 385/11 |
| 4,087,159 | 5/1978 | Ulrich | 385/39 |
| 4,838,630 | 6/1989 | Jannson | 359/127 |
| 4,906,839 | 3/1990 | Lee | 250/239 |
| 4,917,450 | 4/1990 | Pocholle | 385/14 |
| 5,061,027 | 10/1991 | Richard | 385/14 |
| 5,082,368 | 1/1992 | Fuchs et al. | 356/73.1 |
| 5,101,460 | 3/1992 | Richard | 385/37 |
| 5,121,182 | 6/1992 | Kuroda et al. | 257/432 |
| 5,129,041 | 7/1992 | Pernick | 359/11 |
| 5,159,473 | 10/1992 | Feldman | 359/1 |
| 5,185,814 | 2/1993 | Healey | 385/27 |

FOREIGN PATENT DOCUMENTS 0390445  10/1990  European Pat. Off. .

OTHER PUBLICATIONS

J. Goodman et al., "Optical Interconnections for VLSI Systems", Proceedings of the IEEE, vol. 72, No. 7, Jul. 1984, pp. 850–866.

Primary Examiner—Akm E. Ullah
Attorney, Agent, or Firm—Bruce T. Neel

[57] ABSTRACT

An opto-isolator (10) increases optical efficiency by using holographic elements (22,24,26) to direct a beam of light (34) through an optical waveguide (20). An opto-electronic transmitter (12) and receiver (16) are connected to the waveguide to be in alignment with the beam of light reflected by the holographic elements. The transmitter and receiver are disposed on separate leadframe portions (14, 18), and the opto-isolator is surrounded by a package (32).

20 Claims, 1 Drawing Sheet

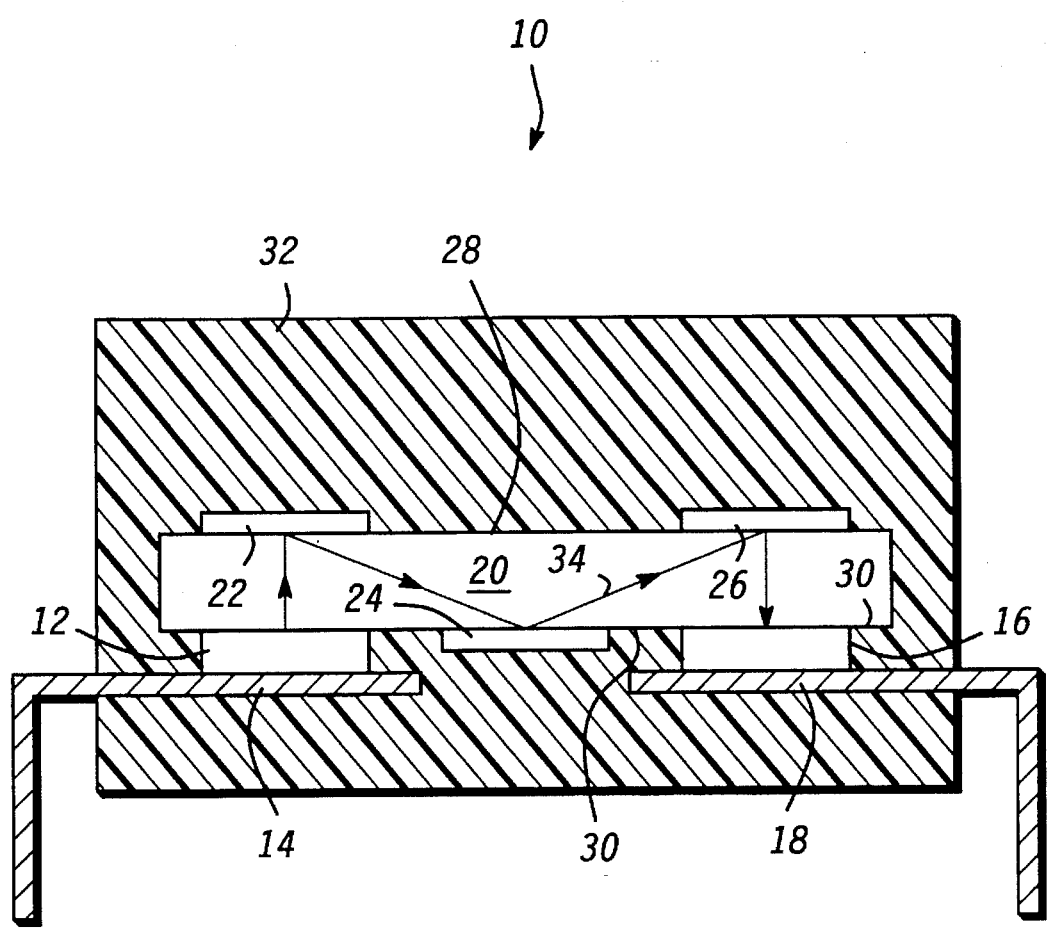

HOLOGRAPHIC OPTICAL ISOLATOR UTILIZING OPTO-ELECTRONIC TRANSMITTER AND RECEIVER DISPOSED IN A PACKAGE

BACKGROUND OF THE INVENTION

The present invention relates, in general, to optical devices and, more particularly, to optical coupling of an opto-electronic transmitter and receiver.

Opto-isolators are used where it is desirable to electrically isolate two sections of an electronic circuit, for example, to provide improved noise isolation or to prevent user contact with a high-voltage power supply. One prior opto-isolator provides a light-emitting diode (LED) and photo-detector on electrically separated halves of a leadframe so that the LED and the photo-detector are in a common plane. An optically transparent material surrounds the LED and photo-detector, and this material is disposed in a cavity that is surrounded by an optically reflective packaging material. Light from the LED is reflected off of the reflective walls of the cavity onto the photo-detector.

A problem with this prior opto-isolator is that light strikes the photo-detector only after typically several reflections off the surface of the cavity's reflective wall. As a result of this stray light scattering, a large percentage of the light from the LED never strikes the active surface of the photo-detector, and the efficiency of the opto-isolator is greatly decreased. Accordingly, it is desirable to have an opto-isolator in which stray scattering of light from the LED is significantly reduced so that the efficiency of the opto-isolator is improved.

BRIEF DESCRIPTION OF THE DRAWING

The sole FIGURE is a cross-sectional view of an optical isolator according to one embodiment of the present invention.

DETAILED DESCRIPTION OF THE DRAWING

Briefly stated, the present invention provides an optical isolator (also known and referred to herein as an opto-isolator) for transmitting an optical signal from an opto-electronic transmitter to an opto-electronic receiver. The transmitter and receiver are disposed on separate portions of a leadframe, and a planar optical waveguide is physically connected to the transmitter and the receiver to provide an optical link therebetween. The waveguide has at least one holographic element disposed on it to direct a beam of light from the transmitter to the receiver through the waveguide. A package surrounds at least the portions of the leadframe that support the transmitter and the receiver.

The present invention can be more fully described with reference to the sole figure, which illustrates a cross-sectional view of an optical isolator 10. An opto-electronic transmitter 12 is disposed on a first leadframe portion 14, and an opto-electronic receiver 16 is disposed on a second leadframe portion 18. A planar optical waveguide 20 has a bottom surface 30 disposed on both transmitter 12 and receiver 16. Holographic elements 22 and 26 are disposed on a top surface 28 of waveguide 20, and a holographic element 24 is disposed on bottom surface 30 of waveguide 20. Holographic elements 22, 24, and 26 are aligned relative to one another and to transmitter 12 and receiver 16 so that a beam of light 34 is transmitted from transmitter 12, reflected by holographic elements 22, 24, and 26, and sensed by an active region of receiver 16. A package 32 encapsulates transmitter 12, receiver 16, leadframe portions 14 and 18, waveguide 20, and holographic elements 22, 24, and 26.

According to the present invention, first leadframe portion 14 and second leadframe portion 18 are disposed in a substantially common plane. In a preferred embodiment, this is accomplished by forming portions 14 and 18 from a common sheet of conductive material such as, for example, a conventional leadframe. As an alternative, leadframe portions 14 and 18 can be provided from separate metal sheets. An advantage to using a common sheet of conductive material is that transmitter 12 and receiver 16 can be bonded to a single leadframe during assembly and prior to the formation of package 32. This simplifies assembly and reduces the manufacturing cost of optical isolator 10.

Waveguide 20 is generally a photo-transmissive electrical insulator such as, for example, plastic or glass, and waveguide 20 is provided so that leadframe portion 14 and leadframe portion 18 can be electrically isolated while still providing a signal path between transmitter 12 and receiver 16.

Holographic elements 22, 24, and 26 are formed from conventional materials using known processing methods. More specifically, each holographic element is preferably made with a photo-sensitive film (also sometimes referred to as a holographic material) having a thickness of less than about 100 microns. This film is commercially available, for example, in the form of a dichromated gelatin, a silver halide gelatin, or a photopolymer. The film emulsion is preferably coated on waveguide 20 and then exposed to conventional laser recording processing to provide the film with its directional reflective properties. Alternatively, instead of exposing the film emulsion while disposed on waveguide 20, un-exposed holographic elements 22, 24, and 26 may be disposed on a separate optically transparent substrate (not shown) such as mylar. Then, elements 22, 24, and 26 are exposed to conventional laser processing to provide their directional reflective properties. After this exposure, elements 22, 24, and 26 are transferred from the optically transparent substrate to waveguide 20.

One of skill in the art recognizes that the relative positions of holographic elements 22, 24, and 26, transmitter 12, and receiver 16 determine the angles of reflection that must be imparted by holographic elements 22, 24, and 26. These angles of reflection are determined using conventional techniques and are fixed during laser exposure of the photo-sensitive holographic film as is known. Further details regarding the use of holographic elements in a related optical application are described in U.S. Pat. No. 5,061,027 (issued to F. Richard on Oct. 29, 1991, and titled "Solder-Bump Attached Optical Interconnect Structure Utilizing Holographic Elements and Method of Making Same"), and in U.S. Pat. No. 5,101,460 (issued to F. Richard on Mar. 31, 1992, and titled "Simultaneous Bidirectional Optical Interconnect"), which are both hereby incorporated by reference in full.

Transmitter 12, receiver 16, and holographic elements 22, 24, and 26 are attached, for example, to waveguide 20 using an optically clear adhesive. Transmitter 12 can be any of many conventional optical transmitters including LEDs and semiconductor laser diodes, and receiver 16 generally can be any photo-sensitive circuit such as, for example, a conventional photo-detector.

Electrical connections such as wire-bonds from transmitter 12 and receiver 16 to their respective leadframe portions 14 and 18 may be made by providing openings (not shown)

in waveguide 20 as required such as by cutting or etching of waveguide 20. Alternatively, an end of either transmitter 12 or receiver 16 can be extended past the edge of waveguide 20, and the wire-bond can be made to this exposed end. Package 32 preferably fully encapsulates leadframe portions 14 and 18, transmitter 12, receiver 16, waveguide 20, and holographic elements 22, 24, and 26. The material used to form package 32 is, for example, a conventional molding compound such as a plastic. An advantage of this encapsulation by package 32 is that optical isolator 10 is not influenced by ambient light. Another advantage of isolator 10 relative to prior opto-isolators is that the material used to form package 32 need not be formed of a reflective material. This is so because beam of light 34 is solely reflected by holographic elements 22, 24, and 26, and no reflection of beam of light 34 from the interface between waveguide 20 and package 32 is required.

The manufacturing techniques used to assemble optical isolator 10 and the formation of package 32 are both conventional. Package 32 is preferably formed around leadframe portions 14 and 18 prior to their being electrically isolated. When a common leadframe is used, leadframe portions 14 and 18 are electrically isolated, for example, by trimming away the non-essential portions of the common leadframe such as the interconnect rails, damn-bars, and cross-bars after encapsulation.

The physical dimensions of package 32 and the distance between transmitter 12 and receiver 16 will, of course, vary with the particular application. However, it is desirable that optical isolator 10 have a small size in which, for example, transmitter 12 and receiver 16 are separated by a distance of less than about 5 millimeters. Also, the thickness of planar optical waveguide 20 will vary, but preferably has a thickness less than about 3 millimeters.

Although a single opto-electronic receiver 16 is shown in the sole figure, in other embodiments multiple receivers (not shown) may be optically coupled to single opto-electronic transmitter 12. This is accomplished by splitting beam of light 34 into two or more rays of light using, for example, holographic element 26. In such an embodiment, each ray of light is reflected to impinge on a different opto-electronic receiver. For example, a second receiver (not shown) can be disposed on leadframe portion 18 proximate to receiver 16 and also in contact with bottom surface 30 of waveguide 20 so as to be impinged by a second ray of light split off from holographic element 26.

In addition to the above, as an alternative embodiment of the present invention, one of skill in the art will recognize that a single holographic element (not shown) can be used instead of three holographic elements. This is accomplished by placing the single holographic element on surface 28 of optical waveguide 20 so that beam of light 34 is reflected directly from transmitter 12 through waveguide 20 to the single holographic element and back through waveguide 20 to receiver 16. In this alternative embodiment, the single holographic element is placed on surface 28 and positioned horizontally somewhere between transmitter 12 and receiver 16. This embodiment typically requires different angles of reflection for the single holographic element, as compared to the use of three holographic elements above, and these angles can be determined using standard geometric computations. It is believed that the use of a single holographic element as just described may provide an optical efficiency for optical isolator 10 that is greater than with the use of three holographic elements as described in the first embodiment above.

By now, it should be appreciated that there has been described a novel optical isolator that has a significantly improved efficiency because it does not depend on light scattering from a reflective cavity wall for its optical signal path. Instead, the light transmitted by the opto-electronic transmitter of the present invention is directed by reflection from holographic films in a controlled, repeatable manner. One advantage is that optical losses due to scattering are minimal. Also, it is another advantage of the present invention that both the opto-electronic transmitter and receiver can be formed on the same leadframe, thus reducing manufacturing complexity and cost. Because a common leadframe may be used in this manner, conventional, low-cost packaging can be used to encapsulate the optical isolator.

The foregoing discussion discloses and describes merely exemplary methods and embodiments of the present invention. As will be understood by those familiar with the art, the invention may be embodied in other specific forms without departing from the spirit or essential characteristics thereof. For example, more than three holographic elements can be used with appropriate changes in their alignment and angles of reflection. Accordingly, the disclosure of the present invention is intended to be illustrative, but not limiting, of the scope of the invention, which is set forth in the following claims.

We claim:

1. An optical isolator comprising:

a first leadframe portion and a second leadframe portion, wherein said first leadframe portion and said second leadframe portion are electrically isolated and disposed in a substantially common plane;

an opto-electronic transmitter disposed on said first leadframe portion;

a first opto-electronic receiver disposed on said second leadframe portion;

a planar optical waveguide having a top surface and a bottom surface, wherein said bottom surface is disposed on said transmitter and said first opto-electronic receiver;

a first holographic element disposed on said top surface of said optical waveguide and aligned with said transmitter so that a beam of light emitted from said transmitter is reflected by said first holographic element into said optical waveguide;

a second holographic element disposed on said bottom surface of said optical waveguide and aligned relative to said first holographic element so that said beam of light is reflected by said second holographic element into said optical waveguide;

a third holographic element disposed on said top surface of said optical waveguide and aligned relative to both said second holographic element and said first opto-electronic receiver so that said beam of light is reflected by said third holographic element onto said first opto-electronic receiver; and a package encapsulating at least said first leadframe portion, said second leadframe portion, said transmitter, and said first opto-electronic receiver.

2. The optical isolator of claim 1 wherein said optical waveguide is selected from the group consisting of glass and plastic.

3. The optical isolator of claim 1 wherein said package is formed from a molding compound.

4. The optical isolator of claim 1 wherein said opto-electronic transmitter is a light-emitting diode.

5. The optical isolator of claim 1 wherein said first opto-electronic receiver is a photo-detector.

6. The optical isolator of claim 1 wherein said first leadframe portion and said second leadframe portion are formed from a common sheet of conductive material.

7. The optical isolator of claim 1 wherein said first holographic element has a thickness of less than about 100 microns.

8. The optical isolator of claim 1 wherein said opto-electronic transmitter and said first opto-electronic receiver are separated by a distance of less than about 5 millimeters.

9. The optical isolator of claim 1 wherein said package further encapsulates said optical waveguide, said first holographic element, said second holographic element, and said third holographic element.

10. The optical isolator of claim 1 wherein at least one of said first, second, and third holographic elements splits said beam of light into a first ray and a second ray, said first ray impinges said first opto-electronic receiver, and said second ray impinges a second opto-electronic receiver.

11. An optical isolator comprising:
- a first leadframe portion and a second leadframe portion, wherein said first leadframe portion and said second leadframe portion are electrically isolated, disposed in a substantially common plane, and formed from a common sheet of conductive material;
- an opto-electronic transmitter disposed on said first leadframe portion;
- an opto-electronic receiver disposed on said second leadframe portion, wherein a distance between said opto-electronic transmitter and opto-electronic receiver is less than about 5 millimeters;
- a planar optical waveguide of a thickness less than about 3 millimeters and having a top surface and a bottom surface, wherein said bottom surface is disposed on said opto-electronic transmitter and said opto-electronic receiver;
- a first holographic element having a thickness of less than about 100 microns, disposed on said top surface of said optical waveguide, and aligned with said opto-electronic transmitter so that a beam of light emitted from said opto-electronic transmitter is reflected by said first holographic element into said optical waveguide;
- a second holographic element having a thickness of less than about 100 microns, disposed on said bottom surface of said optical waveguide, and aligned relative to said first holographic element so that said beam of light is reflected by said second holographic element into said optical waveguide;
- a third holographic element having a thickness of less than about 100 microns, disposed on said top surface of said optical waveguide, and aligned relative to both said second holographic element and said opto-electronic receiver so that said beam of light is reflected by said third holographic element onto said opto-electronic receiver; and
- a package encapsulating at least said first leadframe portion, said second leadframe portion, said opto-electronic transmitter, and said opto-electronic receiver.

12. The optical isolator of claim 11 wherein said package further encapsulates said optical waveguide, said first holographic element, said second holographic element, and said third holographic element.

13. The optical isolator of claim 12 wherein said first leadframe portion and said second leadframe portion are encapsulated by said package prior to being electrically isolated.

14. An optical isolator comprising:
- a first leadframe portion and a second leadframe portion, wherein said first leadframe portion and said second leadframe portion are electrically isolated and disposed in a substantially common plane;
- an opto-electronic transmitter disposed on said first leadframe portion;
- an first opto-electronic receiver disposed on said second leadframe portion;
- a planar optical waveguide having a first surface and a second surface, wherein said second surface is disposed on said opto-electronic transmitter and said first opto-electronic receiver;
- a holographic element disposed on said first surface of said optical waveguide and aligned with said opto-electronic transmitter and said first opto-electronic receiver so that a beam of light emitted from said opto-electronic transmitter is reflected by said holographic element through said optical waveguide onto said first opto-electronic receiver; and
- a package encapsulating at least said first leadframe portion, said second leadframe portion, said opto-electronic transmitter, and said first opto-electronic receiver.

15. The optical isolator of claim 14 wherein said optical waveguide is selected from the group consisting of glass and plastic.

16. The optical isolator of claim 14 wherein said package is formed from a molding compound.

17. The optical isolator of claim 14 wherein said opto-electronic transmitter is a light-emitting diode.

18. The optical isolator of claim 14 wherein said first leadframe portion and said second leadframe portion are formed from a common sheet of conductive material.

19. The optical isolator of claim 14 wherein said opto-electronic transmitter and said first opto-electronic receiver are separated by a distance of less than about 5 millimeters.

20. The optical isolator of claim 14 wherein said holographic element splits said beam of light into a first ray and a second ray, said first ray impinges said first opto-electronic receiver, and said second ray impinges a second opto-electronic receiver.

* * * * *